(12) United States Patent
Sanchez Bermudez et al.

(10) Patent No.: US 10,783,707 B2
(45) Date of Patent: Sep. 22, 2020

(54) DETERMINING A SET OF FACETS THAT REPRESENTS A SKIN OF A REAL OBJECT

(71) Applicant: Dassault Systemes, Velizy Villacoublay (FR)

(72) Inventors: Fernando Manuel Sanchez Bermudez, Velizy Villacoublay (FR); Mourad Boufarguine, Velizy Villacoublay (FR); Guillaume Randon, Velizy Villacoublay (FR)

(73) Assignee: Dassault Systemes, Velizy Villacoublay (FR)

( * ) Notice: Subject to any disclaimer, the term of this patent is extended or adjusted under 35 U.S.C. 154(b) by 0 days.

(21) Appl. No.: 16/230,841

(22) Filed: Dec. 21, 2018

(65) Prior Publication Data

US 2019/0197775 A1 Jun. 27, 2019

(30) Foreign Application Priority Data

Dec. 22, 2017 (EP) ...................................... 7306907

(51) Int. Cl.
*G06T 17/20* (2006.01)
*G06T 17/30* (2006.01)
*G06F 30/00* (2020.01)

(52) U.S. Cl.
CPC .............. *G06T 17/20* (2013.01); *G06F 30/00* (2020.01); *G06T 17/30* (2013.01)

(58) Field of Classification Search
CPC ..................... G06T 17/20; G06T 17/30; G06T 2207/10028; G06T 7/11; G06T 2207/30244; G06T 7/33; G06T 7/73; G06T 2207/30252; G06T 17/00; G06F 17/50

See application file for complete search history.

(56) References Cited

U.S. PATENT DOCUMENTS

2006/0061566 A1* 3/2006 Verma ..................... G06T 17/00
345/419
2012/0308157 A1* 12/2012 Kisilev ................... G06F 17/11
382/286

OTHER PUBLICATIONS

European Search Report dated Jun. 6, 2018 in European Application No. EP17306907.1.

(Continued)

*Primary Examiner* — Xilin Guo
(74) *Attorney, Agent, or Firm* — Oblon, McClelland, Maier & Neustadt, L.L.P.

(57) ABSTRACT

The disclosure notably relates to a computer-implemented method for 3D reconstruction. The method comprises providing a 3D point cloud representing a real object. The method also comprises fitting the 3D point cloud with parametric surfaces. The method also comprises defining a partition of the parametric surfaces into oriented facets which respect intersections between the parametric surfaces. The method also comprises determining, among the oriented facets of the partition, a set of facets that represents a skin of the real object. The determining comprises minimizing an energy. The energy includes a data term and a constraint term. The data term increasingly penalizes discarding facets, as a level of fit between a discarded facet and the 3D point cloud increases. The constraint term penalizes formation of non-skin geometry by kept facets. Such a method provides an improved solution for 3D reconstruction.

18 Claims, 7 Drawing Sheets

(56) References Cited

OTHER PUBLICATIONS

R. Hartley and A. Zisserman: Multiple View Geometry in Computer Vision, Cambridge Univ. Press New York, NY, USA 2003 (Abstract only).
R. Szeliski: Computer Vision: Algorithms and Applications, Edition Springer 2010. http://szeliski.org/Book/drafts/SzeliskiBook_20100903_draft.pdf.
Faugeras: Three-Dimensional Computer Vision: A Geometric viewpoint, MIT Press 1994 (Abstract only).
Yan Cui et al.: 3D Shape Scanning with a Time-of-Flight Camera, CVPR 2010.
RS. Izadi et al.: KinectFusion: Real-Time Dense Surface Mapping and Tracking, Symposium ISMAR 2011.
R. Newcombe et al.: Live Dense Reconstruction with a Single Moving Camera, IEEE ICCV2011.
Jenke, P., Krückeberg, B. & Straßer, W., 2008. Surface Reconstruction from Fitted Shape Primitives, Vision, Modeling, and Visualization (VMV), pp. 31-40 (Abstract only).
Schnabel, R., Degener, P. & Klein, R., 2009. Completion and reconstruction with primitive shapes. Computer Graphics Forum, 28(2), pp. 503-512 (Abstract only).
Boykov, Y. & Kolmogorov, V., 2004. An experimental comparison of min-cut/max-flow algorithms for energy minimization in vision. IEEE transactions on pattern analysis and machine intelligence, 26(9), pp. 1124-1137 (Abstract only).
Verdie, Y., Lafarge, F. & Alliez, P., 2015. LOD Generation for Urban Scenes. ACM Transactions on Graphics, 34(3), pp. 1-14.
Nan Liangliang et al: "PolyFit: Polygonal Surface Reconstruction from Point Clouds", 2017 IEEE International Conference on Computer Vision (ICCV), IEEE, Oct. 22, 2017 (Oct. 22, 2017), pp. 2372-2380.
Alexandre Boulch et al—"Piecewise-Planar 3D Reconstruction with Edge and Corner Regularization"—Computer Graphic Forum Aug. 1, 2014, pp. 55-64.
Anonymous: "Linear programming relaxation", Wikipedia, May 16, 2017 (May 16, 2017). Retrieved from the Internet: URL :https://en.wikipedia.org/w/index.php?title-Li near_programming_relaxation &oldid=780713556 [retrieved on Mar. 28, 2018].
Anonymous: "CS787: Advanced Algorithms Lecture 10: LP Relaxation and Rounding", Sep. 21, 2017 (Sep. 21, 2017). Retrieved from the Internet: URL:https ://web.archive.org/web/20170921 21 2900if_/ http:// pages.cs.wisc.edu :80/ æ shuchi/courses/787-F09/scribe-notes/ lec10.pdf [retrieved on Mar. 28, 2018].
Schnabel, R., Wahl, R. & Klein, R., 2007. Efficient RANSAC for point-cloud shape detection. Computer Graphics Forum, 26(2), pp. 214-226. (Abstract only).
Marquardt, D., 1963. An Algorithm for Least-Squares Estimation of Nonlinear Parameters. SIAM Journal on Applied Mathematics, 11(2), p. 431-441.

\* cited by examiner

| Number of "keep" labelled nodes | No constraints are violated | Constraints are violated |
|---|---|---|
| 0 | [diagram] | |
| 1 | | [diagrams] |
| 2 | [diagrams] | [diagrams] |
| 3 | | [diagrams] |
| 4 | | [diagram] |

DETERMINING A SET OF FACETS THAT REPRESENTS A SKIN OF A REAL OBJECT

CROSS-REFERENCE TO RELATED APPLICATIONS

This application claims priority under 35 U.S.C. § 119 or 365 to European Application No. EP 17306907.1, filed Dec. 22, 2017. The entire contents of the above application(s) are incorporated herein by reference.

FIELD OF THE INVENTION

The invention relates to the field of computer programs and systems, and more specifically to a method, system and program for three-dimensional (3D) reconstruction.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behaviour of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systémes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

In this context and other contexts, the field of computer vision and computer graphics offers technologies which are more and more useful. Indeed, computer vision notably provides solutions for 3D reconstruction, which can be used for 3D model texturing and/or 3D immersive experience (for example virtual reality or augmented reality).

Two approaches to 3D reconstruction are widely known.

The first approach uses "receiver" sensors. This notably concerns 3D reconstruction from RGB images analysis. Here, 3D reconstruction is obtained by multi-view analysis of RGB color information contained in each of the image planes. The following papers relate to this approach:

"R. Hartley and A. Zisserman: *Multiple View Geometry in Computer Vision*, Cambridge Univ. Press 2004";
"R. Szeliski: *Computer Vision: Algorithms and Applications*, Edition Springer 2010"; and
"Faugeras: *Three-Dimensional Computer Vision: A Geometric viewpoint*, MIT Press 1994".

The second approach uses "emitter-receiver" sensors. This notably concerns 3D reconstruction from RGB-Depth images analysis. This kind of sensors gives additional depth data to standard RGB data, and it is depth information that is mainly used in the reconstruction process. The following papers relate to this approach:

"Yan Cui et al.: *3D Shape Scanning with a Time-of-Flight Camera*, CVPR 2010";
"R S. Izadi et al.: *KinectFusion: Real-Time Dense Surface Mapping and Tracking*, Symposium ISMAR 2011"; and
"R. Newcombe et al.: *Live Dense Reconstruction with a Single Moving Camera*, IEEE ICCV2011".

Moreover, several academic and industrial players now offer software solutions for 3D reconstruction, by RGB image analysis, such as Acute3D, Autodesk, VisualSFM, or by RGB-Depth analysis, such as ReconstructMe or Microsoft's SDK for Kinect (registered trademarks).

Known 3D reconstructions techniques involve a 3D point cloud outputted by measurements on a real object. The 3D point cloud may then be transformed in a 3D modeled object format which can then be used for any application. The 3D modeled object may for example comprise a closed surface representing a skin of the real object.

Some known solutions comprise fitting the 3D point cloud with parametric surfaces then combined in a closed surface. However, once the parametric surfaces (usually, primitive shapes such as planes, cylinders, spheres, etc.) have been detected it is not trivial to derive the way those parametric surfaces are combined in order to form a closed surface representing the hull of the reconstructed solid. Note that those parametric surfaces might be infinite (e.g. an unbounded plane). Many researchers have tackled this issue.

In paper "Jenke, P., Kruckeberg, B. & StraRer, W., 2008. Surface Reconstruction from Fitted Shape Primitives, *Vision, Modeling, and Visualization* (VMV), pp. 31-40", the authors estimate the boundaries to the detected set of parametric surfaces. Then, they perform an optimization on the estimated boundaries so that boundaries of neighboring parametric surfaces coincide. Those operations are complex and non-trivial. Moreover, input point clouds are often incomplete and contain holes, in this case, the estimated boundary of a parametric shape might not match any other surface boundary resulting in a non-closed final surface, which obviously cannot represent a real solid.

To solve this issue, in paper "Schnabel, R., Degener, P. & Klein, R., 2009. Completion and reconstruction with primitive shapes. *Computer Graphics Forum*, 28(2), pp. 503-512", the authors propose a different solution which deals with missing parts of the solid and surface completion. To this end, the space surrounding the point cloud is divided into a 3D voxel grid. This grid is represented by a graph, each node represents a voxel connected to its twenty-six neighbors by directed edges. The main idea is to affect a label "in" or "out" to each node. The solid hull should thus separate the voxels labelled as "in" and "out". This is achieved by minimizing a three terms energy defined over the graph by a graph-cut approach similar to those described in paper "Boykov, Y. & Kolmogorov, V., 2004. An experimental comparison of min-cut/max-flow algorithms for energy minimization in vision. *IEEE transactions on pattern analysis and machine intelligence*, 26(9), pp. 1124-1137". The minimization is constrained by a set of voxels which labels are imposed. Those constraints are set by estimating the extension of the detected parametric surfaces and setting the labels of the voxels surrounding them as "in" or "out" depending on which side of the surface the voxel is located.

Ideally, one expects that two neighboring voxels labelled as "in" and "out" are separated by a single parametric surface so that the final solid boundary is composed by a combination of those parametric surfaces. However, it is possible that two neighboring voxels labelled as "in" and "out" are separated by any or by more than one parametric surfaces. In those cases a second optimization stage is required.

A similar approach is described by the authors of paper "Verdie, Y., Lafarge, F. & Alliez, P., 2015. LOD Generation for Urban Scenes. *ACM Transactions on Graphics*, 34(3), pp. 1-14" for building reconstruction from an input mesh. They avoid additional optimization steps and reduce the dimension of the graph by considering the detected parametric surfaces as spatial frontiers. The 3D cells stemming from this spatial division form the nodes of a graph. Nodes representing cells separated by a given parametric surface are linked by edges. Instead of relying on a previously estimated set of "in" and "out" nodes constraining the optimization, they introduce a weight on the minimization energy which translates the probability of a node to be labelled "in" or "out". To this end, they build a 3D regular grid. For each element of the grid (that they call "anchor") they estimate whether it is inside or outside the building thanks to the original mesh. Then, they derive an "in"/"out" measure for each graph node depending on the ration of "in"/"out" anchors lying on the corresponding cell. Their final solid is composed by the cells labelled as "in" after the optimization.

The above-cited existing propositions are not entirely satisfactory, notably because:

The approach in paper "Jenke, et al., 2008" is not designed for solid reconstruction. As a result, if the estimated boundaries of the parametric surfaces are not correctly optimized, the final result may contain holes. Moreover, noisy point clouds or with missing information might cause the boundary estimation to fail.

The solution in paper "Schnabel, et al., 2009" requires additional optimization steps depending on whether there are none, one or more parametric surfaces between neighboring voxels labelled as "in" and "out". It introduces complex calculations that might be avoided. Moreover, the obtained results heavily depend on the division of the space into a grid. Different grid sizes lead to different solutions. The optimized graph is different and the additional optimization steps may vary as well.

Results in paper "Verdie, et al., 2015" may also depend on the 3D grid resolution as the energy defined on the graph nodes depends on it. Moreover, a point cloud does not contain all the necessary information to carry out the approach as it requires an initial surface (input mesh) in order to estimate if an anchor is inside or outside the solid.

Within this context, there is still a need for an improved solution for 3D reconstruction.

SUMMARY OF THE INVENTION

It is therefore provided a computer-implemented method for 3D reconstruction. The method comprises providing a 3D point cloud representing a real object. The method also comprises fitting the 3D point cloud with parametric surfaces. The method also comprises defining a partition of the parametric surfaces into oriented facets which respect intersections between the parametric surfaces. The method also comprises determining, among the oriented facets of the partition, a set of facets that represents a skin of the real object. The determining comprises minimizing an energy. The energy includes a data term and a constraint term. The data term increasingly penalizes discarding facets, as a level of fit between a discarded facet and the 3D point cloud increases. The constraint term penalizes formation of non-skin geometry by kept facets.

The method may comprise one or more of the following:

non-skin geometry is formed, for each group of four neighboring facets, by a number of kept facets different from 0 and 2, or by a number of kept facets equal to 2 which have inconsistent orientations;

the energy explores a continuum of labels assignable to each respective one of the facets and representing a level of confidence for keeping the respective facet;

the determining further comprises selecting which facets to keep and which facets to discard based on the assigned labels;

deciding which facets to keep and which facets to discard based on the assigned labels comprises comparing each assigned label to a predetermined threshold;

minimizing the energy comprises a continuous optimization;

the energy has free variables;

the data term is monotonous relative to each one of the free variables;

the constraint term has summed elements which are each monotonous relative to each of their free variables when the other free variables are fixed;

the constraint term is of the type: $E_{constraint}^r = \Sigma_{a \in A} \text{cost}(c_a^r)$ with $c_a^r = \max(0, -l_1^r l_3^r + 1) + \max(0, -l_2^r - l_4^r + 1) + |\min(l_1^r, l_3^r) - \min(l_2^r, l_4^r)|$ where A is the set of groups of four neighboring facets, a is a group of four neighboring facets i, cost(•) is a cost function, and $l_i^r$ is the label assigned to facet i, facets 1 and 2 belong to a respective same parametric surface and facets 3 and 4 belong to a respective same parametric surface;

the level of fit between a facet and the 3D point cloud corresponds to a facet density;

the facet density is equal to a number of points associated to a facet divided by an area of the facet;

fitting the 3D point cloud with the parametric surfaces comprises a RANSAC algorithm;

providing the 3D point cloud representing a real object comprises providing a physical instance of the real object and one or more sensing devices, performing one or more measurements on the physical instance with the one or more sensing devices, and outputting the 3D point cloud based on the one or more measurements; and/or the one or more sensing devices comprise a lidar, a depth sensor, and/or a camera configured for structure-from-motion analysis.

It is further provided a computer program comprising instructions for performing the method.

It is further provided a computer readable storage medium having recorded thereon the computer program.

It is further provided a system comprising a processor coupled to a memory, the memory having recorded thereon the computer program.

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

Figure 1:
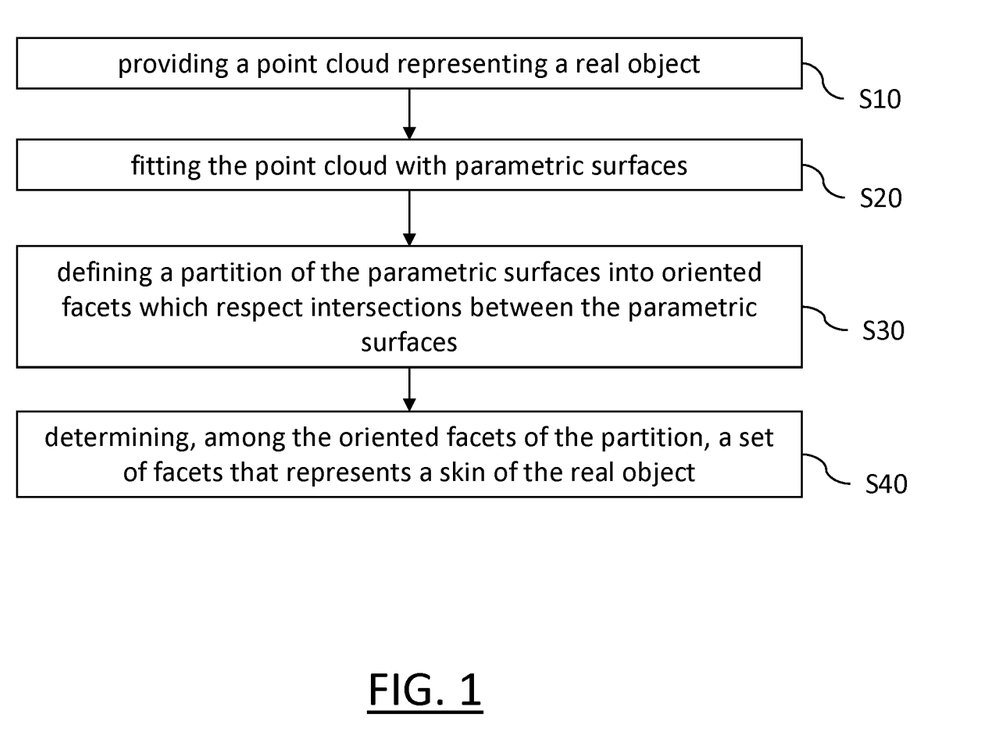
FIG. 1 shows a flowchart of an example of the method.

With reference to the flowchart of FIG. 1, it is proposed a computer-implemented method for 3D reconstruction. The method comprises providing S10 a 3D point cloud representing a real object. The method also comprises fitting S20 the 3D point cloud with parametric surfaces. The method also comprises defining S30 a partition of the parametric surfaces into oriented facets which respect intersections between the parametric surfaces. The method also comprises determining S40, among the oriented facets of the partition, a set of facets that represents a skin of the real object. The determining comprises minimizing an energy. The energy includes a data term and a constraint term. The data term increasingly penalizes discarding facets, as a level of fit between a discarded facet and the 3D point cloud increases. The constraint term penalizes, for each group of four neighboring facets, formation of non-skin geometry by kept facets. Such a method improves the field of 3D reconstruction, where the expression "3D reconstruction" designates any computerized construction of a 3D modeled object representing the real object based on a 3D point cloud representing the real object, and where the 3D modeled object hereby comprises or consists of the set of facets determined at S40.

Notably, the method determines at S40 a set of facets of parametric surfaces that forms a 3D modeled object representing a skin of the real object. The method determines such a 3D modeled object based on a 3D point cloud provided at S10. The method specifically proposes to fit at S20 the 3D point cloud with parametric surfaces and to use intersections between the parametric surfaces in order to define at S30 facets candidate to being kept. Such intersections are easily definable. The method then determines at S40 kept facets among the candidates. This allows passing from a 3D point cloud which forms relatively poor information to a more exploitable 3D representation of a 2D manifold, in other words to a geometrical object representative of a solid's skin.

Furthermore, the method proposes to determine at S40 the kept set of facets via minimization of a specific energy that allows reaching a particularly accurate result. In specific, the data term allows reducing the risk of discarding facets which fit well the 3D point cloud and are thereby good candidates. Also, the constraint term reduces the risk of keeping facets which combined together form topological errors. Dissociating such effects via two distinct terms (i.e. the data term and the constraint term) allows a relatively fast and robust minimization. Also, the constraint term may in examples involve, as an argument, groups of four neighboring facets only, and thus the constraint term provides a relatively fast way to control topological errors. In examples, the energy may consist of the data term and the constraint term (i.e. with no other term). In such examples, the minimization is particularly fast.

The real object may consist of one solid unit, for example formed by a (e.g. industrial) product or a (e.g. mechanical) part, or alternatively by an assembly of one or more such products and/or one or more such parts, all physically connected together. The real object may alternatively consist of several such solid units which are physically disconnected, one unit from the other. The pipeline of the method allows for an accurate 3D reconstruction even in such latter case, since it does not make before the minimization restrictive assumptions with respect to physical connection.

The method is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

For instance, the providing S10 may be performed by or after a user operates one or more sensing devices. The fitting S20, defining S30 and/or determining S40 may be performed fully automatically or semi-automatically.

A typical example of computer-implementation of a method is to perform the method with a system adapted for this purpose. The system may notably comprise a processor coupled to a memory. The memory may have recorded thereon a computer program causing the processor to execute the method. The memory may also store a database. The memory is any hardware adapted for such storage, possibly comprising several physical distinct parts (e.g. one for the program, and possibly one for the database).

The system may in examples comprise a graphical user interface (GUI) coupled to the processor. The GUI may be configured for inputting commands by the user, and/or displaying to the user the 3D point cloud provided at S10, the parametric surfaces fitted at S20 and/or after they are partitioned at S30, and/or the set of facets determined at S40.

Alternatively or additionally, the system may comprise one or more sensing devices configured for performing one or more measurements on a physical instance of a real object and outputting a 3D point cloud representing the real object. A sensing device is an apparatus integrating one or more sensors each configured to acquire a respective physical signal via sensing measurements. A sensing device may thus be used to perform measurements on its environment, including acquiring one or more such physical signals. A sensing device may notably be operated on a physical object to perform the measurements on a zone including at least part of the outer surface of a physical object. The operation may be repeated so as to fully cover the outer surface of the physical object. One may speak of "scanning" the physical object in such a case.

The 3D point cloud provided at S10 may thus stem from a process comprising providing a physical instance of the real object and the one or more sensing devices. The real object may be provided in any location, such as a room of a factory and/or of a laboratory. The process may then comprise performing one or more measurements on the physical instance with the one or more sensing devices. For example, one or more sensors may be operated on the physical instance and/or at different points of view relative to the physical instance (e.g. turned around the physical instance), for example by a user. In other words, the physical instance may be scanned. As known per se, the one or more sensing devices may be configured to output a 3D point cloud representing outer geometry of the physical instance of the real object or any other data processable for the system so as to output such 3D point cloud.

The one or more sensing devices may for example comprise or consist of one or more lidars, one or more depth sensors, and/or one or more (e.g. RGB) cameras configured for structure-from-motion analysis.

The method generally manipulates modeled objects. A modeled object is any object defined by data stored e.g. in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system, as will be apparent from the definitions of such systems provided below.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

The real object may be a product to be manufactured in the real world subsequent to the completion of its virtual design with for instance a CAD software solution or CAD system, such as a (e.g. mechanical) part or assembly of parts (or equivalently an assembly of parts, as the assembly of parts may be seen as a part itself from the point of view of the method, or the method may be applied independently to each part of the assembly), or more generally any rigid body assembly (e.g. a mobile mechanism). A CAD software solution allows the design of products in various and unlimited industrial fields, including: aerospace, architecture, construction, consumer goods, high-tech devices, industrial equipment, transportation, marine, and/or offshore oil/gas production or transportation. The 3D modeled object obtained by the method may thus represent an industrial product which may be any mechanical part, such as a part of a terrestrial vehicle (including e.g. car and light truck equipment, racing cars, motorcycles, truck and motor equipment, trucks and buses, trains), a part of an aerial vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a general mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

By PLM system, it is additionally meant any system adapted for the management of a modeled object representing a physical manufactured product (or product to be manufactured). In a PLM system, a modeled object is thus defined by data suitable for the manufacturing of a physical object. These may typically be dimension values and/or tolerance values. For a correct manufacturing of an object, it is indeed better to have such values.

By CAM solution, it is additionally meant any solution, software of hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. Such CAM solutions are provided by Dassault Systemes under the trademark DELMIA®.

By CAE solution, it is additionally meant any solution, software of hardware, adapted for the analysis of the physical behavior of a modeled object. A well-known and widely used CAE technique is the Finite Element Method (FEM) which typically involves a division of a modeled objet into elements which physical behaviors can be computed and simulated through equations. Such CAE solutions are provided by Dassault Systemes under the trademark SIMULIA®. Another growing CAE technique involves the modeling and analysis of complex systems composed a plurality components from different fields of physics without CAD geometry data. CAE solutions allow the simulation and thus the optimization, the improvement and the validation of products to manufacture. Such CAE solutions are provided by Dassault Systemes under the trademark DYMOLA®.

PDM stands for Product Data Management. By PDM solution, it is meant any solution, software of hardware, adapted for managing all types of data related to a particular product. A PDM solution may be used by all actors involved in the lifecycle of a product: primarily engineers but also including project managers, finance people, sales people and buyers. A PDM solution is generally based on a product-oriented database. It allows the actors to share consistent data on their products and therefore prevents actors from using divergent data. Such PDM solutions are provided by Dassault Systemes under the trademark ENOVIA®.

Figure 2:
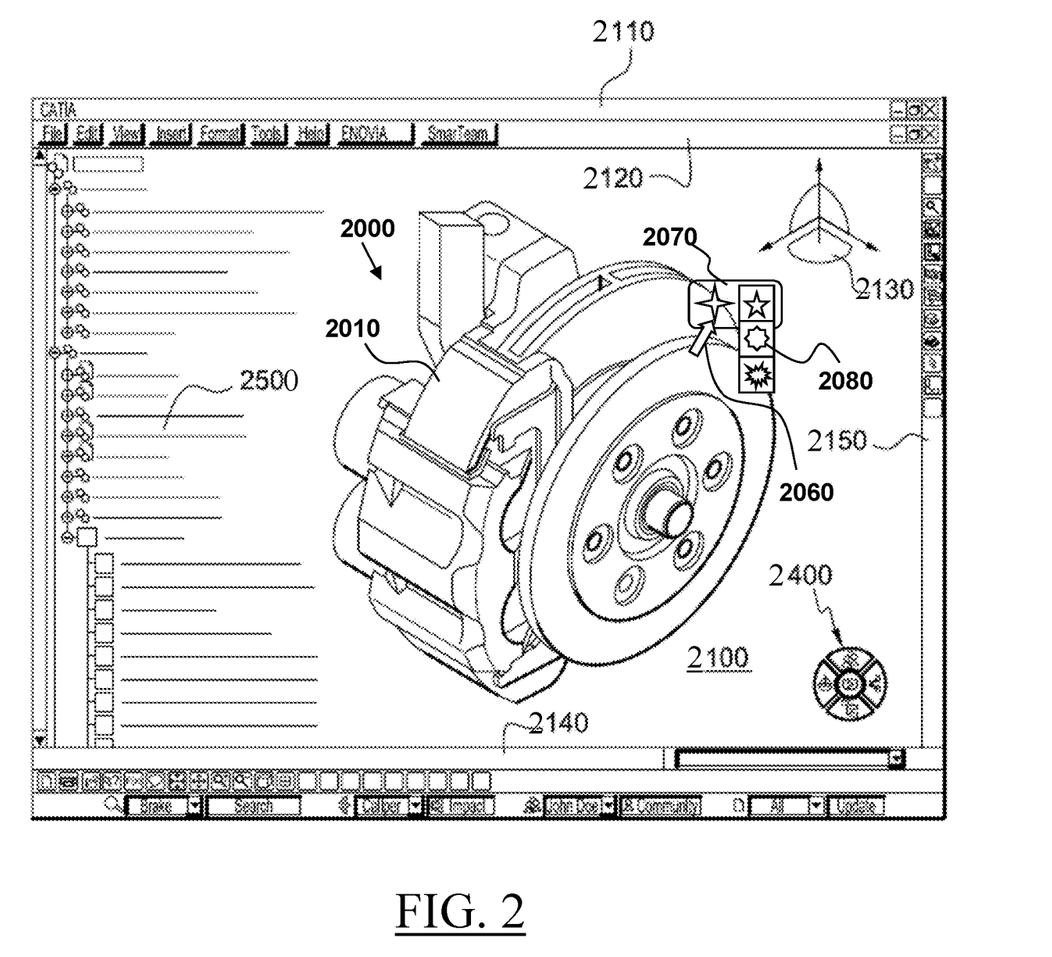
FIG. 2 shows an example of a graphical user interface of the system.

FIG. 2 shows an example of the GUI of the system, wherein the system is a CAD system. The set of facets determined at S40 may be displayed with such a GUI.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen. The GUI may for example display data 2500 related to the displayed product 2000. In the example of the figure, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 3:
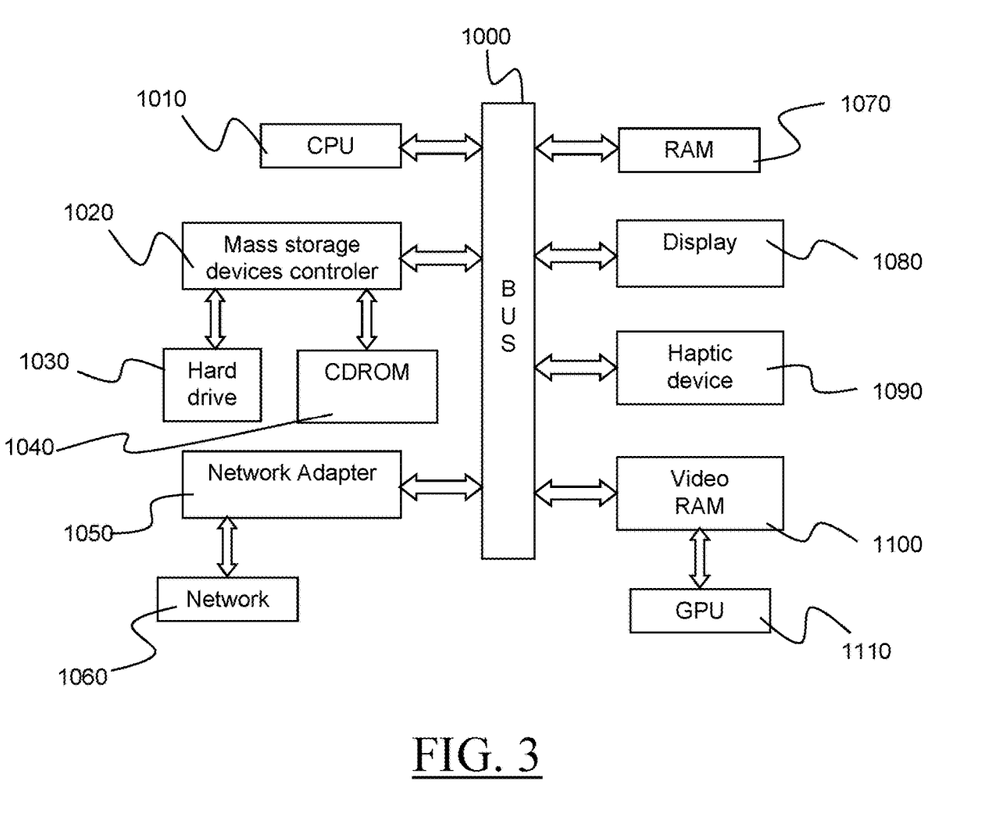
FIG. 3 shows an example of the system.

FIG. 3 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

The method may be included in a manufacturing process, which may comprise, after performing the method, producing one or more physical instances of the real object based on the 3D modeled object outputted by the method. Because the method improves the design of the modeled object, the method also improves the manufacturing of a product and thus increases productivity of the manufacturing process.

The method may alternatively or additionally be included in a 3D scene design process, which may comprise initializing the 3D scene and, after performing the method, inserting the 3D modeled object outputted by the method inside the 3D scene. The 3D scene may be a virtual reality scene, an augmented reality scene, or a video game scene. The method thereby allows inserting accurate and realistic representations of real objects easily in such scenes.

The 3D point cloud provided at S10 is any data structure comprising a set of 3D points representing outer geometry of the physical instance of the real object. The 3D point cloud may be outputted in any way, e.g. raw (i.e. as an unstructured set of points) or as vertices of a mesh. The 3D point cloud provided at S10 may be oriented, meaning that each point is associated to a vector indicative of a direction pointing outwardly (equivalently, inwardly) relative to the solid formed by the real object (e.g. an optionally normal to the surface of the real object). The 3D point cloud may be outputted by the one or more sensors already oriented, or alternatively be oriented afterwards via any known algorithm.

The fitting S20 is now discussed.

A parametric surface outputted by S20 may be infinite or finite.

The fitting S20 may be performed via any predetermined 3D-point-cloud-fitting algorithm known per se. The predetermined 3D-point-cloud-fitting algorithm may comprise executing an optimization program. The optimization program may penalize value of a predetermined distance between the point cloud and the resulting parametric surfaces. The optimization program may also penalize other quantities, for example including the number of resulting parametric surfaces and/or a level of irregularity of the resulting parametric surfaces.

The parametric surfaces may each be defined as one or more continuous functions of one or more parameters (e.g. two parameters), such as NURBS or Bézier surfaces.

The defining S30 is now discussed.

A facet defined at S30 may be finite or infinite.

A facet is a connected portion of a parametric surface (e.g. possibly the whole parametric portion if the portion is not a strict portion). An oriented facet is a facet associated with a vector. In the case of the method, the vector is indicative of a direction pointing outwardly (equivalently, inwardly) relative to the solid formed by the real object.

As previously discussed, known 3D-point-cloud-fitting algorithms do not output parametric surfaces which form a closed surface perfectly representative of a skin of the real object. Rather, known 3D-point-cloud-fitting algorithms output an unorganized set of parametric surfaces including pairs of parametric surfaces intersecting one another. In the general case, two parametric surfaces intersecting one another define one or more continuous-curve-intersections between them. Each respective continuous-curve-intersection defines for each of the two parametric surface at least a portion of the boundary of a respective facet. Facets are thereby formed and delimited by one or more such continuous-curve-intersections.

The partition defined by the method at S30 is a set of facets, wherein each given facet of the set is a portion of a respective given parametric surface outputted by S20 and (if the given facet is not the whole respective given parametric surface) delimited (e.g. only) by one or more intersections each between the respective given parametric surface and a respective other parametric surface, or any subdivision such set. The partition may in examples be the largest set of facets respecting such criteria. In other examples, the partition may be a subdivision or partitioning of said largest set of facets respecting such criteria.

The defining S30 may be performed in any way, for example including computing the intersections.

The determining S40 is now discussed.

The determining S40 selects in the set of facets outputted by S30 a subset to be considered as representing a skin of the real object. The skin of the real object is its outer surface, also referred to in the field of CAD by the terms "hull" or "envelope".

The determining S40 performs such selection by executing an optimization algorithm which comprises minimizing a predetermined energy whose value depends on predetermined free variables associated to candidate facets. The candidate facets may be all those outputted by S30 or a preselection thereof provided by any pre-processing. In examples, each candidate facet yields one respective free variable. Each free variable may vary in a predetermined domain indicative of its respective facet being kept or discarded. The result of the energy minimization thus provides an optimal value of the free variables. The optimal values may then be used in any way to eventually decide which facets to keep and which facets to discard. The predetermined domain may consist of two values, one value corresponding to keeping the facet and the other value corresponding to discarding the facet. Alternatively, the predetermined domain may be a discrete set or a continuum between boundary values, one boundary value corresponding to keeping the facet and the other boundary value corresponding to discarding the facet.

The energy may be formulated in any way as long as it includes several terms including the following discussed data term and constraint term.

The data term is any term that penalizes discarding facets in a manner that would be unfit with respect to the initial data (i.e. the 3D point cloud). In examples, the data term may correspond to (e.g. be defined as) a sum of penalties over the set of candidate facets, each penalty corresponding to one and only one facet. Each penalty is the value of a same predetermined penalty function. The penalty function is an increasing function of a parameter representative of a level of level of fit between the facet and the 3D point cloud. In other words, the more a given facet fits the 3D point cloud provided at S10, the more discarding the given facet is penalized by the energy. The level of fit can be determined in any way, examples being provided later. In other examples, the data term may involve penalties defined for groups of facets.

The constraint term is any term that penalizes, for groups of facets, formation of non-skin geometry by kept facets. In other words, the constraint term constraints kept facets to form skin geometry. In examples, the constraint term may correspond to (e.g. be defined as) a sum of penalties over the set of (e.g. all) groups of four neighbors (i.e. a group of four neighbors being a set of four facets wherein all pairs of facets are neighbors one of the other) in the set of candidate facets, each penalty corresponding to one and only one group. In other examples, the constraint term may involve other arguments.

The method defines at S30 the partition with respect to intersections each between two respective parametric surfaces. Each intersection may yield a respective group of four neighboring facets. The facets of such respective group are neighbors because they are delimited (each at least partly) by a same curve-intersection. It is noted here that exceptional cases where less than four or more than four facets are neighbors do not occur in practice, but can be handled in any way at the determining S40 (for example by being discarded from the minimization or be assigned to one or more other constraint terms).

The constraint term penalizes situations where the set of facets eventually outputted by S40 comprises groups of such kind which are inconsistent with respect to solid representation. Such inconsistency may for example occur when one volume sector is indicated as inside the real object by one delimiting facet and as outside the real object by another delimiting facet. In examples, non-skin geometry may be considered to be formed, with respect to a given group of four neighboring facets of such kind, each time a number of facets different from 0 and 2 (in other words equal to 1, 3 or 4) is eventually kept, or each time a number of facets equal to 2 is kept but the two kept facets have inconsistent orientations.

A particularly efficient example of the method is now described.

The example comprises specific independent implementations of S10-S40 which synergistically allow reaching a set of facets that represents the real object particularly accurately and in a particularly fast manner.

The method of the example takes a point cloud as input and computes a set of parametric surfaces. Once the surfaces have been computed it divides them into the so called "facets". A facet may typically be a portion of a given parametric surface delimited by the intersections between the parametric surfaces hosting the facet and others parametric surfaces. The method of the example aims at finding the set of facets constituting the closed hull of the object represented by the input point cloud.

In order to achieve this goal a graph is built and optimized. Each node of the graph represents a facet and graph arcs link neighboring facets. A label between "keep" and "discard" is associated to each node and an error function depending on the node labels is defined over the graph. This function is defined so that it is minimized when the set of facets which associated nodes are labelled as "keep" corresponds to the closed hull of the object represented by the input point cloud.

The energy minimization in this approach is defined so that its minimum corresponds to a closed surface, allowing the reconstruction of solid objects, which is not the case of the approach followed by paper "Jenke, et al., 2008". Moreover, there is no need of estimating any surface extension or boundary, which may be source of dysfunctions in case of noisy or missing data in the approaches followed by paper "Jenke, et al., 2008" and paper "Schnabel, et al., 2009".

The method of the example does not require any arbitrary partition of the space as opposed to the approaches followed by paper "Schnabel, et al., 2009" and paper "Verdie, et al., 2015". Recall that in papers "Schnabel, et al., 2009" and "Verdie, et al., 2015", different partitions of the space may lead to arbitrary different results.

Also, the method of the example takes a point cloud as input and does not need any input surfaces, such as surface of a mesh. On the contrary, the procedure in paper "Verdie, et al., 2015" procedure requires such a mesh as input (and such mesh is not always available). In other words, the method of the example may be executed even if no mesh is present before S20, or without using such mesh if it is present.

The method of the example aims to reconstruct a regular closed surface, composed by a combination of parametric surfaces, representing the physical hull of a solid object.

A global pipeline to carry out the method of the example is as follows:

1. Take a point cloud as input (S10)
2. Compute a set of parametric surfaces (S20)
3. Compute the set of "facets" forming the partition (S30)
4. Consider the facets graph (S40)
5. Define the energy function over the graph (S40)
6. Minimize the energy function (S40)
7. Recover the solid hull (S40)

Example details on each of the steps of the pipeline are now discussed.

1. Take a Point Cloud as Input (S10)

Figure 4:
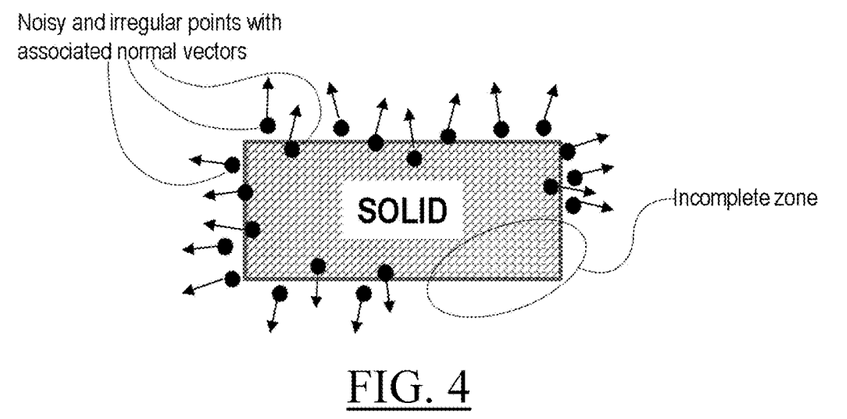
FIGS. 4, 5, 6, 7, 8, 9, 10, 11 and 12 illustrate the method.

The input point cloud may be a collection of 3D points representing a solid object. The point cloud may be irregular, noisy or incomplete due to acquisition artifacts. Each point may be associated to a normal vector, that is, a unary 3D vector estimating the tangent direction of the solid surface pointing outwards. FIG. 4 represents this by showing a two-dimensional scheme of a noisy, irregular and incomplete point cloud representing a solid surface.

Such a point cloud may stem from a 3D scanner, photogrammetry reconstruction, etc. In case a mesh is provided, a point cloud may be extracted by considering the set of vertices or by sampling points on the surface representing the mesh.

2. Compute a Set of Parametric Surfaces (S20)

A set of parametric surfaces may be computed from the input cloud. There exist several ways to extract a set of parametric surfaces from a point cloud. One way to perform such fitting of the 3D point cloud with the parametric surfaces may comprise executing a Random sample consensus (RANSAC) algorithm, for example as described by paper "Schnabel, R., Wahl, R. & Klein, R., 2007. Efficient RANSAC for point-cloud shape detection. *Computer Graphics Forum*, 26(2), pp. 214-226." Each parametric surface may be associated to the subset of points from which it is derived. The two sides of the parametric surfaces may be labelled as "in" and "out". The side labelling might be estimated from the normal vectors of the points associated to the parametric surface. Recall that a parametric surface might potentially be infinite, a planar surface for example.

3. Compute the Set of "Facets" Forming the Partition (S30)

Figure 5:
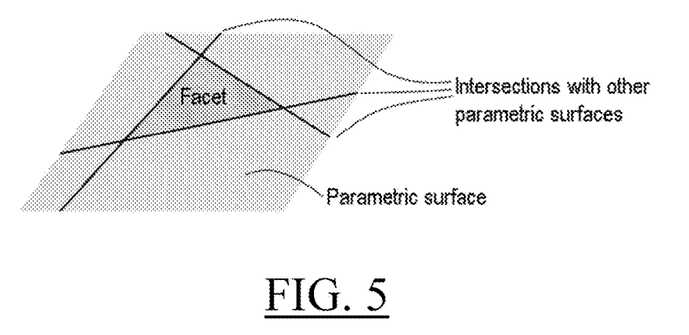

The intersections between the parametric surfaces may be computed. A facet is a portion of a parametric surface delimited by the intersections between the parametric surfaces hosting the facet and others parametric surfaces. This is illustrated considering planar surfaces by FIG. 5, which shows a representation of a facet.

The two sides of the facets may be labelled as "in" and "out" according to the corresponding side labeling of the parametric surface from which the facet stems.

A subset of the points previously associated to the corresponding parametric surface may be associated to each facet. This subset may be empty. This task may be achieved in several manners. In a tested implementation, the points were orthogonally projected into their associated parametric surface and a point was associated to a facet if its projection lied into it.

4. Consider the Facets Graph (S40)

A graph containing a set of nodes (N) and a set of arcs (A) may be considered. Each node of the graph represents a facet and graph arcs link neighboring facets. Note that each edge links four facets: the two facets of a given parametric surface sharing an edge but also the two facets of the parametric surface generating the intersection sharing the same edge. This is illustrated by FIG. 6.

Figure 6:
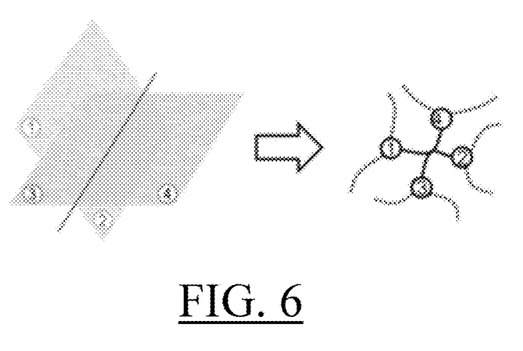

FIG. 6 shows, on the left side, two parametric surfaces intersect each other. It is supposed that those surfaces intersect with other surfaces (not represented). Facets 1, 2, 3 and 4 are delimited by those intersections. Facets 1, 2, 3 and 4 share an edge: the intersection between the surfaces shown on FIG. 6.

FIG. 6 shows, on the right side, that as facets 1, 2, 3 and 4 share an edge, the nodes representing them in the graph are all linked by an arc. The nodes are eventually linked to other nodes, representing other neighboring facets (dotted arcs on the figure).

A label ($l_n$) "keep" or "discard" may be associated to each node (n) as well as a fitting measure ($fm_n$). The fitting measure evaluates how well a facet fits the input point cloud.

In a tested implementation the fitting measure corresponded to a facet density (i.e. a density of points of the 3D point cloud corresponding to the facet, e.g. a given point corresponding to a respective facet if the respective facet is the nearest one to said given point), computed by dividing the number of points previously associated to a corresponding facet by the area of the facet. The fitting measure may be normalized between 0 and 1. For example, by setting a maximum density and dividing each fitting measure by this value, if the obtained results is higher than 1 it is set to 1. Other fitting measures may be implemented.

5. Define the Energy Function Over the Graph (S40)

The energy function may be defined over the graph. The variables of the function may be the nodes' labels. This energy function may be minimized when the nodes with label $l_n$="keep" form a closed surface as similar as possible to the shape of the solid represented by the input point cloud. In order to achieve this task, the method contemplates a double term energy function:

$$E = E_{data} + E_{constraint}$$

where $E_{data}$ represents the data term and may be minimized when the obtained surface best fits the input data. $E_{constraint}$ represents the constraint term, which heavily penalizes the energy if the obtained surface is not closed. The role of this second term is to enforce the fact that the final solution should tend to be a closed hull.

A possible basis of definition of both terms is provided below.

Data Term

In a tested implementation the following basis data term was considered (other terms may however be considered):

$$E_{data} = \sum_{n \in N} \left( fm_n \mathbb{1}_{\{"discard"\}}(l_n) \right)^2$$

where $\mathbb{1}_{("discard")}(l_n)$ is the indicator function:

$$\mathbb{1}_{\{"discard"\}}(l_n) = \begin{cases} 1 & \text{if } l_n = "discard" \\ 0 & \text{otherwise} \end{cases}$$

It is a squared addition over every node (n) in the set of graph nodes (N) of the fitting measure of the nodes labelled as "discard". This term grows when facets with high fitting measure are discarded, it thus encourages facets with high fitting measure to be labelled as "keep" when minimized.

Constraint Term

In a tested implementation the following basis constraint term was used (other terms may however be contemplated):

$$E_{constraint} = \sum_{a \in A} (\lambda c_a)^2$$

It is a squared addition over every arc (a) of the set of graph arcs (A) of the arc constraints ($c_a$) multiplied by a weighting factor $\lambda$. For every arc (a) an arc constraint ($c_a$) was defined such that it is non-zero if the facets associated to nodes linked by the edge and labelled as "keep" violate the conditions to form a closed hull, and zero otherwise. In particular, the constraint is non-zero if:
  a) the number of "keep" labelled nodes linked by the edge is different from 0 (i.e. any of the four facets form part of the close surface) or 2, or
  b) the number of "keep" labelled nodes linked by the edge is 2 but the "in" and "out" labelling of the corresponding parametric surfaces are not consistent ("in" and "out" sides of the "keep" facets should be the same).

In order to explicit all the possible cases one may consider the nodes linked by an arc e indexed from 1 to 4. Nodes 1 and 2 correspond to facets lying in the same parametric surface and nodes 3 and 4 correspond to facets lying in a parametric surface intersecting with the previous one. This is illustrated by FIG. 7.

Figure 7:
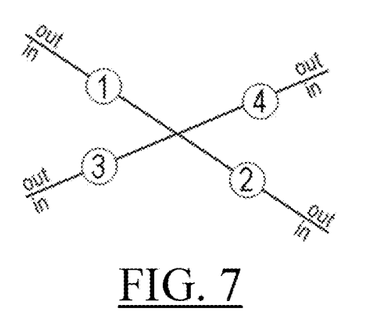

FIG. 7 represents schematically four neighboring facets (cross-section view). Facets 1 and 2 belong to a parametric surface (schematized by a planar surface) and facets 3 and 4 belong to another parametric surface (also schematized by a planar surface) intersecting with the previous one. "in" and "out" sides of the facets are also indicated.

Figure 8:
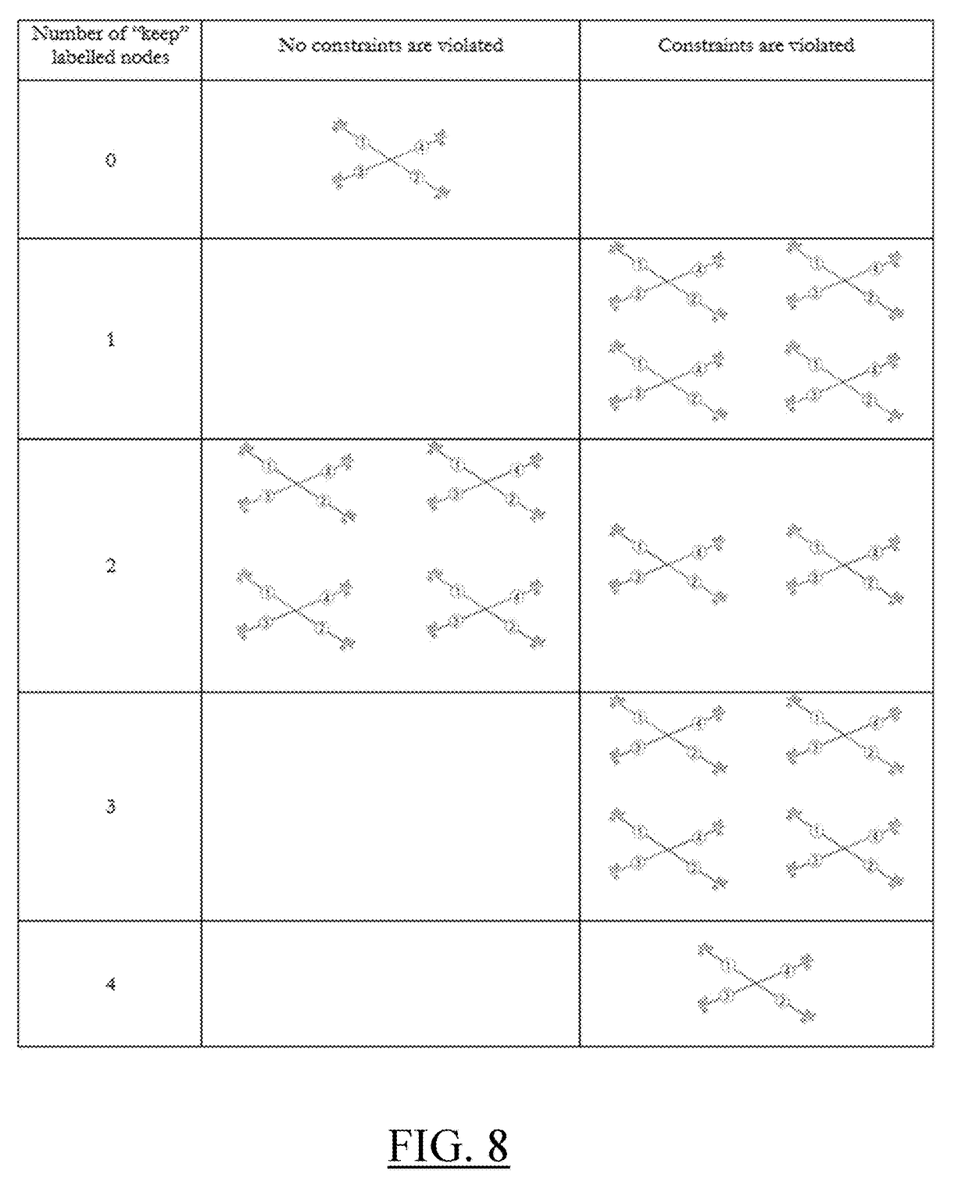

The different possible configurations are explicitly schematized in the table of FIG. 8 where dotted lines represent "discard" labelled facets and solid lines "keep" labelled facets.

The weighting factor $\lambda$ may be large enough so that if a single constraint is violated (having non-zero value) the global error (E) is not minimized. Minimizing this term enforces thus that the obtained surface is closed.

Other costs function than $(\lambda \cdot)^2$ may alternatively be implemented.

6. Minimize the Energy Function (S40)

Problem Relaxation

The energy function (E) depends on the nodes' labels which take discrete values ($l_n \in \{"keep", "discard"\}$). Minimizing that energy may thus consist in finding the combination of nodes with labels "keep" or "discard" that corresponds to a minimal value. Such a combinatorial problem may only be solved by testing all possible combinations of labelling and keeping the one corresponding to the minimum energy. When the number of facets grows, solving the problem may become difficult or impossible because the number of combinations to test is extremely elevated.

Instead, the problem may be relaxed. It may consist in approximating it by a similar but easier problem to solve. To this end, the method of the example may associate the label "discard" to the numerical value 1 and the label "keep" to the numerical value 0 and define the relaxed labels ($l_n^r$) to take real values between 0 and 1 ($l_n^r \in [0,1]$). The method of the example may also define a continuous energy function ($E^r$, called relaxed energy function) which depends on the real valued relaxed labels:

$$E^r = E_{data}^r + E_{constraint}^r$$

In other words, rather than a discrete set of labels (e.g. {"keep", "discard"}, the energy may explore a continuum of labels assignable to each respective one of the facets and representing a level of confidence for keeping the respective facet. In other words, the free variables of the energy may vary in a continuum of values rather that in a discrete set of values. The energy may further be continuous relative to each one of the free variables. In examples, the data term and constraint term may each be continuous relative to each one of the free variables. This allows use at S40 of optimization algorithms relatively accurate e.g. and converging relatively fast.

In examples, the data term may be monotonous relative to each one of the free variables and/or the summed elements (i.e. a summed element being a term of a sum defining the constraint term) of the constraint term may each be monotonous relative to each of their free variables when the other free variables are fixed. This allows reaching a particularly accurate result. In particular, this not only improves the passage from the relaxed and continuous result to the discrete and binary decision (keep or discard), but that also ensures a relatively regular energy and thereby its relatively easy and accurate optimization (with relatively low risk to get stuck in a local minimum).

Relaxed Data Term

In a tested implementation, the following relaxed data term was used:

$$E_{data}^r = \sum_{n \in N} (fm_n l_n^r)^2$$

which behaves similarly to the proposed discrete data term $E_{data}$ when $l_n^r=1$ ("discard") and $l_n^r=0$ ("keep") and linearly between those values.

Other data terms may alternatively be implemented.

Relaxed Constraint Term

In a tested implementation the following relaxed constraint term was used:

$$E_{constraint}^r = \sum_{a \in A} (\lambda c_a^r)^2$$

Again, other costs function than $(\lambda \cdot)^2$ may alternatively be implemented.

Using the node indexation introduced previously with reference to FIG. 7, an explicit formulation of the relaxed constraint $c_a^r$ may be defined as it follows:

$c_a^r = \max(0, -l_1^r - l_3^r + 1) + \max(0, -l_2^r l_4^r + 1) + |\min(l_1^r, l_3^r) - \min(l_2^r, l_4^r)|$ The first term of the constraint penalizes the incompatibility of nodes 1 and 3 to be both labelled as "keep", this incompatibility being a direct consequence of constraint b) and is illustrated in the third, fourth and fifth row of the table of FIG. 8. If $l_1^r$ and $l_3^r$ are both near 0, the term has a positive value. However, if at least one node is labelled as "discard", having a regularized label of 1, the term has zero value.

The second term is equivalent to the first one, but reflecting the incompatibility between nodes 2 and 4.

If one analyzes every possible combination that does not violate any constraint in the table of FIG. 8, one may observe that either none of the nodes are labelled as "keep", either one node among nodes 1 and 3 and one node among nodes 2 and 4 are labelled as "keep". This is enforced by the third term of the regularized constraint. In the first case (all relaxed labels set to 1) $\min(l_1^r, l_3^r) = \min(l_2^r, l_4^r) = 1$ and in the second case, $\min(l_1^r, l_3^r) = \min(l_2^r, l_4^r) = 0$. Otherwise either at least one of the two first terms has a non-zero value, either $\min(l_1^r, l_3^r) \neq \min(l_2^r, l_4^r)$ and the third term has non-zero value.

Relaxed Energy Minimization

The relaxed energy is a continuous function on the relaxed node labels. Therefore, it is possible to use any continuous optimization method to minimize it.

In a tested implementation an energy was defined that can be expressed as a sum of squared errors. As a result, a standard method may be used for solving least squares problems such as the Levenberg-Marquardt algorithm described in paper "Marquardt, D., 1963. An Algorithm for Least-Squares Estimation of Nonlinear Parameters. *SIAM Journal on Applied Mathematics,* 11(2), p. 431-441" (which was tested).

7. Recover the Solid Hull (S40)

After the minimization of the relaxed energy, the discrete nodes' labels may be recovered from the relaxed ones. A simple way to do it may be to fix a threshold between 0 and 1. The relaxed labels above this threshold may be set to "discard" and the relaxed labels below it may be set to "keep". The threshold may be any value for example higher than 0.1 or 0.2 and/or lower than 0.9 or 0.8, such as 0.5. The minimization of the energy dispatches labels efficiently toward the extrema of the [0,1] range, such that no or few label values stand around 0.5. In other words, the algorithm discriminates efficiently between facets to be kept or facets to be discarded.

The final solid hull may in the example be composed the facets associated to the nodes labelled as "keep".

As mentioned above, an implementation of the method in line with the above example details was tested. Results are present with reference to FIGS. 9-12.

Figure 9:
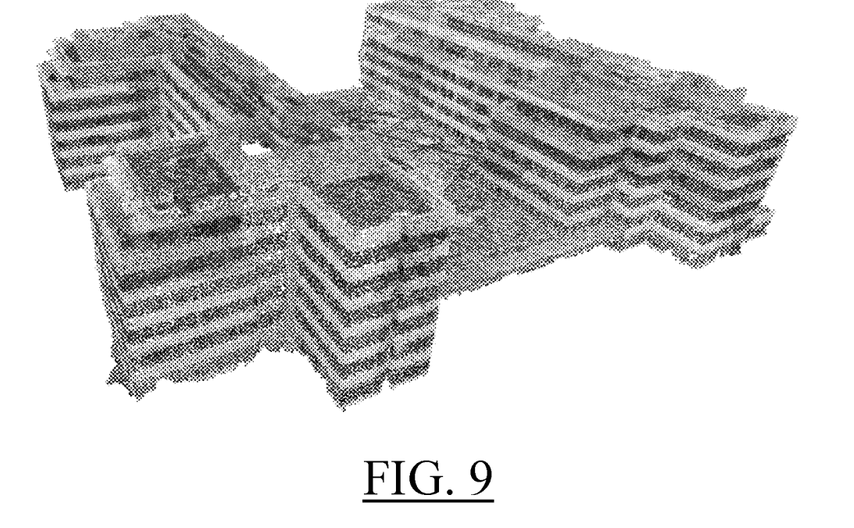

FIG. 9 shows a 3D point cloud provided at S10 and representing a building which was scanned. The 3D point cloud was obtained by photogrammetry (SfM+MVS) based on photos captured by a drone. The SFM or Structure from Motion was performed as described in paper "Schonberger, J. L., & Frahm, J. M. (2016). Structure-from-motion revisited. In Proceedings of the IEEE Conference on Computer Vision and Pattern Recognition (pp. 4104-4113)". The MVS or Multi-View Stereo was performed as described in paper "Schonberger, J. L., Zheng, E., Frahm, J. M., & Pollefeys, M. (2016, October). Pixelwise view selection for unstructured multi-view stereo. In European Conference on Computer Vision (pp. 501-518). Springer International Publishing."

Figure 10:
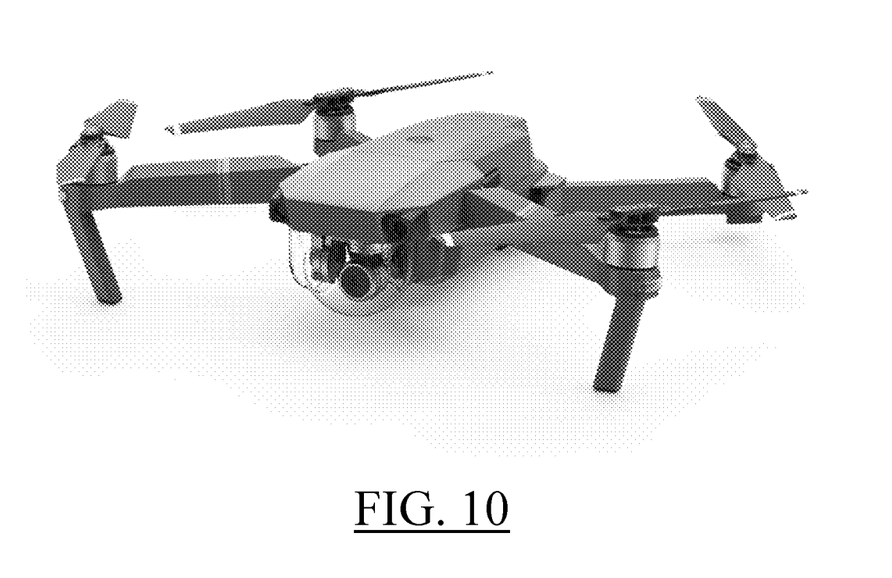

FIG. 10 shows the drone (in other words the sensing device or scanning tool), which was a DJI Mavic Pro drone (registered trademark).

Figure 11:
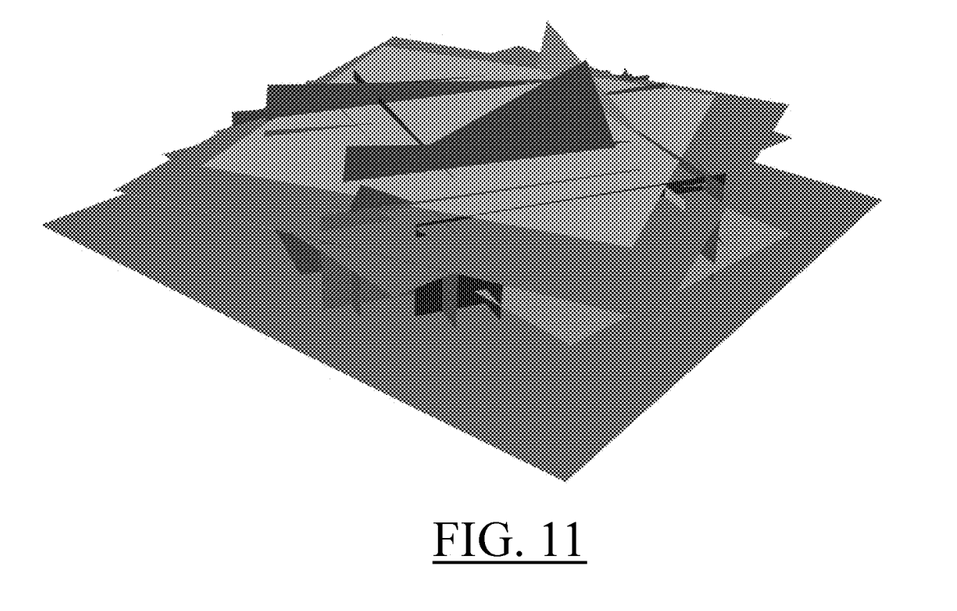

FIG. 11 shows an image representing the parametric surfaces outputted by a RANSAC algorithm at S20 and fitting the 3D point cloud.

Figure 12:
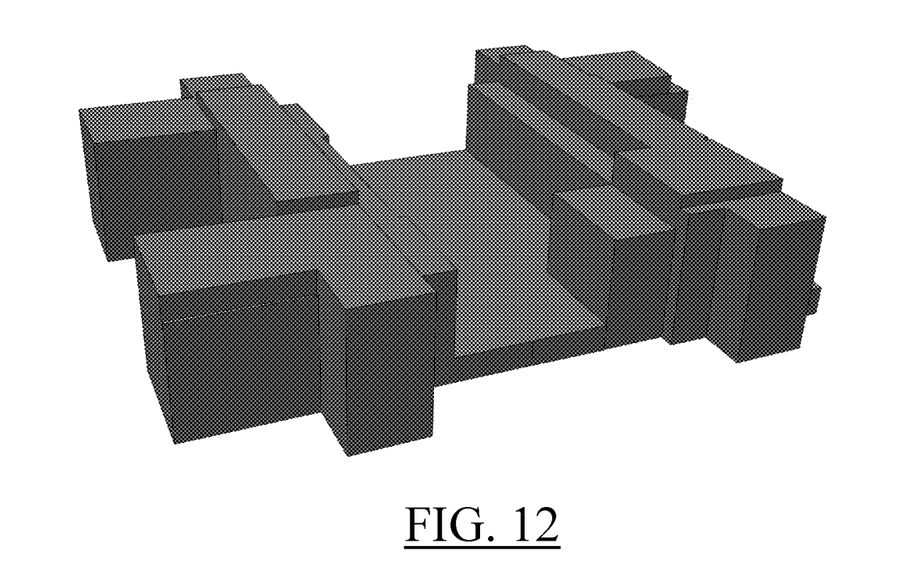

FIG. 12 shows the set of facets resulting from S30 and S40 and representing a skin of the building.

As could be observed, the set of facets represented accurately the building. The mean distance of the point cloud relative to the set of facets was 0.564 m. The method allowed obtaining a solid representation from a (mere) point cloud. Also, the algorithm converged in less than a minute.

The invention claimed is:

1. A computer-implemented method for 3D reconstruction, comprising:
    obtaining a 3D point cloud representing a real object;
    fitting the 3D point cloud with parametric surfaces;
    defining a partition of the parametric surfaces into oriented facets which respect intersections between the parametric surfaces; and
    determining, among the oriented facets of the partition, a set of facets that represents a skin of the real object, the determining including minimizing an energy which includes:
    a data term that increasingly penalizes discarding facets, as a level of fit between a discarded facet and the 3D point cloud increases, and
    a constraint term that penalizes formation of non-skin geometry by kept facets,
    wherein non-skin geometry is formed, for each group of four neighboring facets, in at least two situations including:
        a first situation where the number of kept facets is different from 0 and 2, and
        a second situation where the number of kept facets is equal to 2 and have inconsistent orientations, and
    the constraint term penalizes the at least two situations.

2. The method of claim 1, wherein the energy explores a continuum of labels assignable to each respective one of the facets and representing a level of confidence for keeping the respective facet.

3. The method of claim 2, wherein the determining further comprises selecting which facets to keep and which facets to discard based on the assigned labels.

4. The method of claim 3, wherein deciding which facets to keep and which facets to discard based on the assigned labels, includes comparing each assigned label to a predetermined threshold.

5. The method of claim 2, wherein minimizing the energy includes a continuous optimization.

6. The method of claim 2, wherein:
the energy has free variables, and
the data term is monotonous relative to each one of the free variables, or
the constraint term has summed elements which are each monotonous relative to each of their free variables when the other free variables are fixed, or
the data term is monotonous relative to each one of the free variables and the constraint term has summed elements which are each monotonous relative to each of their free variables when the other free variables are fixed.

7. The method of any one of claim 6, wherein the constraint term is of the type:

$$E_{constraint}^r = \sum_{a \in A} \text{cost}(c_a^r)$$

with $c_a^r = \max(0, -l_1^r - l_3^r + 1) + \max(0, -l_2^r - l_4^r + 1) + |\min(l_1^r, l_3^r) - \min(l_2^r, l_4^r)|$ where:
A is the set of groups of four neighboring facets,
a is a group of four neighboring facets i,
cost(•) is a cost function, and
$l_i^r$ is the label assigned to facet i, facets 1 and 2 belong to a respective same parametric surface and facets 3 and 4 belong to a respective same parametric surface.

8. The method of claim 1, wherein the level of fit between a facet and the 3D point cloud corresponds to a facet density, the facet density being equal to a number of points associated to a facet divided by an area of the facet.

9. The method of claim 1, wherein fitting the 3D point cloud with the parametric surfaces comprises a random sample consensus (RANSAC) algorithm.

10. The method of claim 1, wherein obtaining the 3D point cloud representing a real object comprises:
obtaining a physical instance of the real object and one or more sensing devices;
performing one or more measurements on the physical instance with the one or more sensing devices; and
outputting the 3D point cloud based on the one or more measurements.

11. The method of claim 10, wherein the one or more sensing devices comprise at least from a group consisting of: a lidar, a depth sensor, and a camera configured for structure-from-motion analysis.

12. A non-transitory computer readable storage medium having recorded thereon a computer program comprising instructions for performing a computer-implemented method for 3D reconstruction, the method comprising:
obtaining a 3D point cloud representing a real object;
fitting the 3D point cloud with parametric surfaces;
defining a partition of the parametric surfaces into oriented facets which respect intersections between the parametric surfaces;
determining, among the oriented facets of the partition, a set of facets that represents a skin of the real object, the determining comprising minimizing an energy which includes:
a data term that increasingly penalizes discarding facets, as a level of fit between a discarded facet and the 3D point cloud increases, and
a constraint term that penalizes formation of non-skin geometry by kept facets,
wherein non-skin geometry is formed, for each group of four neighboring facets, in at least two situations including:
a first situation where the number of kept facets is different from 0 and 2, and
a second situation where the number of kept facets is equal to 2 and have inconsistent orientations, and
the constraint term penalizes the at least two situations.

13. The non-transitory computer readable medium of claim 12, wherein the energy explores a continuum of labels assignable to each respective one of the facets and representing a level of confidence for keeping the respective facet.

14. The non-transitory computer readable medium of claim 13, wherein the determining further comprises selecting which facets to keep and which facets to discard based on the assigned labels.

15. The non-transitory computer readable medium of claim 14, wherein deciding which facets to keep and which facets to discard based on the assigned labels comprises comparing each assigned label to a predetermined threshold.

16. The non-transitory computer readable medium of claim 13, wherein minimizing the energy comprises a continuous optimization.

17. The non-transitory computer readable medium of claim 13, wherein:
the energy has free variables, and
the data term is monotonous relative to each one of the free variables, or
the constraint term has summed elements which are each monotonous relative to each of their free variables when the other free variables are fixed, or
the data term is monotonous relative to each one of the free variables and the constraint term has summed elements which are each monotonous relative to each of their free variables when the other free variables are fixed.

18. A system comprising:
a processor coupled to a memory, the memory having recorded thereon a computer program comprising instructions for 3D reconstruction that when executed by the processor cause the processor to be configured to
obtain a 3D point cloud representing a real object;
fit the 3D point cloud with parametric surfaces;
define a partition of the parametric surfaces into oriented facets which respect intersections between the parametric surfaces; and
determine, among the oriented facets of the partition, a set of facets that represents a skin of the real object, the determining comprising minimizing an energy which includes:
a data term that increasingly penalizes discarding facets, as a level of fit between a discarded facet and the 3D point cloud increases, and
a constraint term that penalizes formation of non-skin geometry by kept facets,
wherein non-skin geometry is formed, for each group of four neighboring facets, in at least two situations including:

a first situation where the number of kept facets is different from 0 and 2, and a second situation where the number of kept facets is equal to 2 and have inconsistent orientations, and the constraint term penalizes the at least two situations.

* * * * *

UNITED STATES PATENT AND TRADEMARK OFFICE
CERTIFICATE OF CORRECTION

PATENT NO. : 10,783,707 B2
APPLICATION NO. : 16/230841
DATED : September 22, 2020
INVENTOR(S) : Fernando Manuel Sanchez Bermudez et al.

Page 1 of 1

It is certified that error appears in the above-identified patent and that said Letters Patent is hereby corrected as shown below:

On the Title Page

Item (30), the Foreign Application Priority Data information is incorrect. Item (30) should read:
--(30)  Foreign Application Priority Data
Dec. 22, 2017   (EP).....................17306907.1--

Signed and Sealed this
Seventeenth Day of November, 2020

Andrei Iancu
*Director of the United States Patent and Trademark Office*